United States Patent
So et al.

(10) Patent No.: US 12,245,448 B2
(45) Date of Patent: Mar. 4, 2025

(54) HEAT INSULATING TRANSPARENT TANDEM ORGANIC SOLAR CELLS

(71) Applicants: North Carolina State University, Raleigh, NC (US); NextGen Nano LLC, London (GB)

(72) Inventors: Franky So, Raleigh, NC (US); Carr Hoi Yi Ho, Raleigh, NC (US); Xiangyu Fu, Raleigh, NC (US); Matthew Stone, Tampa, FL (US)

(73) Assignees: North Carolina State University, Raleigh, NC (US); NextGen Nano LLC, London (GB)

( * ) Notice: Subject to any disclaimer, the term of this patent is extended or adjusted under 35 U.S.C. 154(b) by 0 days.

(21) Appl. No.: 17/614,787

(22) PCT Filed: May 28, 2020

(86) PCT No.: PCT/US2020/034928
§ 371 (c)(1),
(2) Date: Nov. 29, 2021

(87) PCT Pub. No.: WO2020/243306
PCT Pub. Date: Dec. 3, 2020

(65) Prior Publication Data
US 2022/0231247 A1    Jul. 21, 2022

Related U.S. Application Data

(60) Provisional application No. 62/853,978, filed on May 29, 2019.

(51) Int. Cl.
*H10K 30/87* (2023.01)
*H10K 30/57* (2023.01)
*H10K 30/82* (2023.01)

(52) U.S. Cl.
CPC .............. *H10K 30/87* (2023.02); *H10K 30/57* (2023.02); *H10K 30/82* (2023.02)

(58) Field of Classification Search
CPC ......... H10K 30/82; H10K 30/87; H10K 30/57
See application file for complete search history.

(56) References Cited

U.S. PATENT DOCUMENTS

| 7,482,532 B2 | 1/2009 | Yi et al. |
| 2005/0094277 A1* | 5/2005 | Khusnatdinov .......... G02B 1/11 428/141 |

(Continued)

OTHER PUBLICATIONS

Sun et al, Heat-insulating multifunctional semitransparent polymer solar cells, (2018) Joule, 2(9), 1816-1826. (Year: 2018).*

(Continued)

*Primary Examiner* — Andrew J Golden
(74) *Attorney, Agent, or Firm* — Thomas | Horstemeyer, LLP

(57) ABSTRACT

An exemplary transparent tandem organic solar cell comprises a transparent substrate; a first transparent electrode disposed on a surface of the transparent substrate; and a series of interconnecting organic active layers disposed on a surface of the first transparent electrode. The series of organic interconnecting active layers comprise at least a front sub-cell that blocks ultraviolet wavelengths from passing through the front sub-cell; and a back sub-cell that blocks infrared wavelengths from passing through the back sub-cell. The solar cell further comprises a distributed Bragg reflector disposed on a surface of the back sub-cell, wherein the distributed Bragg reflector reflects unblocked infrared photons at an interface between the back sub-cell and the distributed Bragg reflector. Additionally, the series of interconnecting organic active layers are configured to allow wavelengths of visible light to pass through the transparent (Continued)

tandem organic solar cell, wherein the transparent tandem organic solar cell is fully transparent.

18 Claims, 5 Drawing Sheets

(56) References Cited

U.S. PATENT DOCUMENTS

| | | | | |
|---|---|---|---|---|
| 2012/0073641 | A1* | 3/2012 | Tseng | H01L 31/0392 |
| | | | | 136/256 |
| 2012/0186623 | A1* | 7/2012 | Bulovic | H01L 27/302 |
| | | | | 257/E31.127 |
| 2013/0008497 | A1 | 1/2013 | Smirnov et al. | |
| 2013/0220406 | A1* | 8/2013 | Day | H01L 31/035281 |
| | | | | 257/E31.124 |
| 2014/0084266 | A1 | 3/2014 | Yang et al. | |
| 2018/0019421 | A1 | 1/2018 | Bulovic et al. | |
| 2018/0047922 | A1 | 2/2018 | Forrest et al. | |
| 2018/0254357 | A1 | 9/2018 | Derkacs et al. | |
| 2018/0366667 | A1 | 12/2018 | Barr et al. | |

OTHER PUBLICATIONS

Sexton et al, Development of Controlled Pitch Nano Arrays for Application in Nano Scale Based Proportional Counters. No. SRNL-L2200-2010-00072. Savannah River Site (SRS), Aiken, SC (United States), 2010. Abstract (Year: 2010).*

International Search Report and Written Opinion for International Application No. PCT/US2020/034928 mailed Sep. 2, 2020.

European Search Report mailed on May 31, 2023 for European Application No. 20814929.4. (Copy Provided).

Chen, Chun-Chao, et al. "High-performance semi-transparent polymer solar cells possessing tandem structures." Energy & Environmental Science 6.9 (2013): 2714-2720.

Meiss, Jan, et al. "Highly efficient semitransparent tandem organic solar cells with complementary absorber materials." Applied Physics Letters 99.4 (2011).

Romero-Gómez, Pablo, et al. "Semi-transparent polymer solar cells." Journal of Photonics for Energy 5.1 (2015): 057212-057212.

* cited by examiner (a)

(b)

HEAT INSULATING TRANSPARENT TANDEM ORGANIC SOLAR CELLS

CROSS-REFERENCE TO RELATED APPLICATIONS

This application is the 35 U.S.C. § 371 national stage application of International Application No. PCT/US2020/034928, filed May 28, 2020, which claims priority to co-pending U.S. provisional application entitled, "Heat Insulating Transparent Tandem Organic Solar Cells," having Ser. No. 62/853,978, filed May 29, 2019, which is entirely incorporated herein by reference.

TECHNICAL FIELD

The present invention is generally related to solar cell technology.

BACKGROUND

For widespread development of photovoltaics, it is critical to develop solar cells that are affordable for integration into standard products and systems. Organic solar cells (OSCs) are considered as a promising technology because they have many attractive merits, such as low cost, rapid energy payback time, light weight, flexibility, and most importantly, transparency. Such transparent solar cells (TSCs) have attracted extensive attention due to their potential for integration into building facades, rooftops, solar windows, automobile windshields, and self-powered electronic devices. The potential market size is increasing tremendously in recent years.

Whereas traditional crystalline silicon TSCs are implemented by diffusing sunlight through an uncovered portion of a panel (that does not contain opaque solar cells), organic TSCs adopt nearly transparent electrodes and ultrathin light absorbing materials which provide good transparency throughout a whole panel. Therefore, in comparison to traditional TSCs, organic TSCs provide a much broader range of coloring and luminosity.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

SUMMARY

Figure 1:
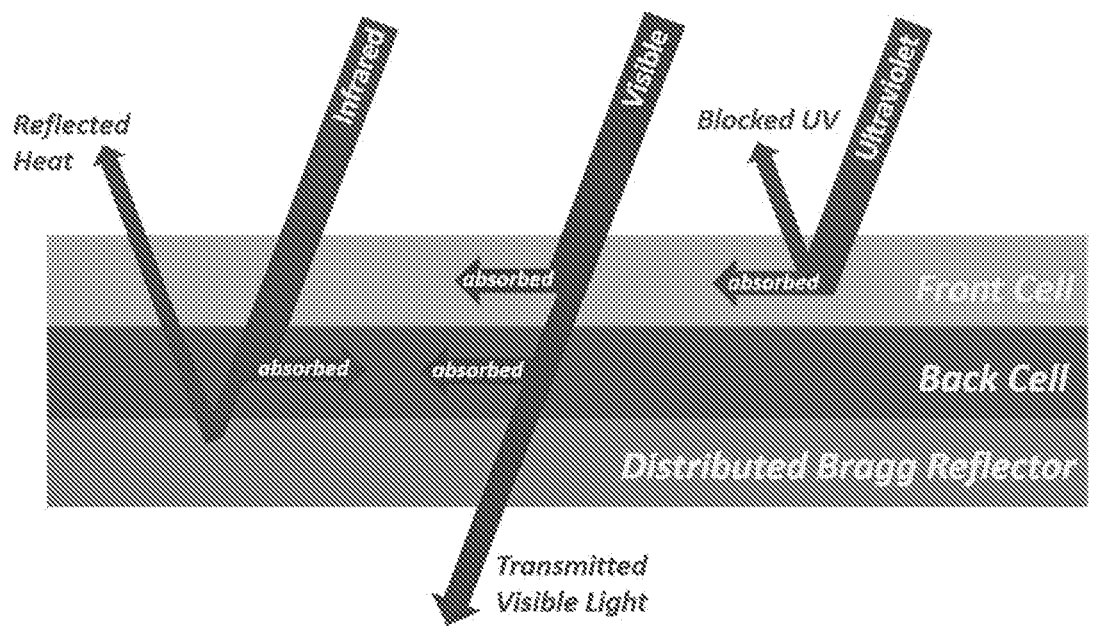
FIG. 1 is a schematic diagram of an exemplary embodiment of a heat insulating transparent tandem organic solar cell in accordance with the present disclosure.

Aspects of the present disclosure are related to a transparent tandem organic solar cell. In one aspect, among others, the transparent tandem organic solar cell comprises a transparent substrate; a first transparent electrode disposed on a surface of the transparent substrate; and a series of interconnecting organic active layers disposed on a surface of the first transparent electrode. The series of organic interconnecting active layers comprises at least a front sub-cell that blocks ultraviolet wavelengths from passing through the front sub-cell; and a back sub-cell that blocks infrared wavelengths from passing through the back sub-cell. Additionally, the transparent tandem organic solar comprises a distributed Bragg reflector disposed on a surface of the back sub-cell, wherein the distributed Bragg reflector reflects unblocked infrared photons at an interface between the back sub-cell and the distributed Bragg reflector. Further, the series of interconnecting organic active layers are configured to allow wavelengths of visible light to pass through the transparent tandem organic solar cell, wherein the transparent tandem organic solar cell is fully transparent.

Aspects of the present disclosure are also related to a method involving implementing a transparent tandem organic solar cell. Such a method comprises disposing a first transparent electrode disposed on a surface of a transparent substrate; disposing a series of interconnecting organic active layers on a surface of the first transparent electrode; configuring the series of interconnecting organic active layers to allow wavelengths of visible light to pass through the series of interconnecting organic active layers, wherein the series of interconnecting organic active layers comprises at least a front sub-cell that blocks ultraviolet wavelengths from passing through the front sub-cell; and a back sub-cell that blocks infrared wavelengths from passing through the back sub-cell; disposing a mirror on a surface of the back sub-cell to form the transparent tandem organic solar cell; and reflecting unblocked infrared photons at an interface between the back sub-cell and the mirror; wherein the transparent tandem organic solar cell is fully transparent.

In one or more aspects, the transparent tandem organic solar cell can be in a form of a film that is applied to a window of a structure. In one or more aspects, the structure can comprise a building or a vehicle. In one or more aspects, the transparent tandem organic solar cell can be integrated into a building façade, rooftop, or an automobile windshield.

In one or more aspects, the distributed Bragg reflector is configured to block heat energy from being supplied through the transparent tandem organic solar cell and/or can comprise a periodic array of Lithium Fluoride (LiF) and Molybdenum Oxide ($MoO_x$) layers.

In one or more aspects, the series of interconnecting organic active layers is configured to convert the blocked wavelengths of light into electricity and/or comprises at least one antireflective coating layer.

In one or more aspects, the transparent tandem organic solar cell can be embedded in a window, integrated into a building façade or rooftop, and/or can be in a form of a film of photovoltaic material. In one or more aspects, the transparent tandem organic solar cell can be a quasi-periodic polycrystal nanopattern structure with different pitch sizes that is coupled to a top or bottom of the transparent tandem organic solar cell.

DETAILED DESCRIPTION

The present disclosure describes embodiments of a high-performance transparent tandem organic solar cell that can be used for power generation and heat insulation at the same time. In one such embodiment, the transparent solar cell is configured to fully utilize ultraviolet (UV) and infrared (IR) regions of a light spectrum while maintaining high transparency by employing or stacking a series of solar cells that can absorb specific invisible wavelengths of light (e.g., ultraviolet and infrared) and convert them into electricity while allowing for visible wavelengths of light to be transmitted. Additionally, a mirror device (e.g., a Distributed Bragg Reflector (DBR)) can be employed to reflect infrared wavelengths of light from being transmitted through the solar cell thereby blocking heat energy from being supplied to an inside of the building by the infrared light, as one non-limiting example. Accordingly, by blocking IR light with DBRs, embodiments of an exemplary transparent solar cells endow the transparent solar cell with enhanced heat insulating properties which opens up a new application for organic transparent solar cells. As an illustration, these heat insulating properties can be used to control a room temperature depending on the way a film of photovoltaic material is applied to a building or vehicle window which can significantly reduce the overall lighting, heating, and cooling costs of a building. Other applications include their integration into building facades, rooftops, solar windows, automobile windshields, and self-powered electronic devices.

Referring now to the figures, FIG. 1 demonstrates the structure of a heat insulating transparent tandem organic solar cell in accordance with embodiments of the present disclosure. In this example, the solar cell is divided into three layers: (1) a front organic sub-cell that absorbs and blocks ultraviolet and short wavelength photons including a portion of the visible light spectrum that is adjacent to the ultraviolet light spectrum; (2) a back organic sub-cell that absorbs long wavelengths and infrared photons including a portion of the visible light spectrum that is adjacent to the infrared light spectrum; and (3) a distributed Bragg reflector (DBR) that reflects unabsorbed infrared photons at an interface between the back cell and the reflector, thereby blocking a source of heat from being emitted through the reflector. In various embodiments, the solar cell can be in the form of a thin film that can be applied to transparent structures, such as a window, or non-transparent structures.

Since organic solar cells are subject to thermalization losses, especially for devices employing low band gap semiconductors, stacking individual cells (also referred as sub-cells) in a series with complementary absorption characteristics is an effective approach to tackling the limitations of single junction solar cells. Such a tandem solar cell enjoys a much higher voltage output due to the series-connected sub-cells. From previous testing, the power conversion efficiency (PCE) of a tandem TSC has been observed to outperform a single solar cell by approximately 50% due to at least the reflection of incoming light, thereby doubling an optical path within the tandem transparent solar cell and increasing light absorption.

Thus, in accordance with the present disclosure, by using a multilayer configuration of interconnecting layers (by electrically connecting sub-cells and a transparent top electrode), an exemplary TSC can be fabricated that sensitizes well in different regions of the infrared (IR) and/or ultraviolet (UV) spectrums and minimizes optical absorption in the visible spectrum. Accordingly, in various embodiments, the interconnecting layers may be composed of an antireflective coating, a transparent substrate, a transparent electrode, multiple active layers, a transparent electrode, a diffractive Bragg reflector, and/or an antireflective coating.

In accordance with various embodiments, an exemplary heat insulating transparent tandem organic solar cell is designed to have good transmittance in the visible region (400-700 nm). In general, the transparency of a TSC can be determined by the average visible transmittance (AVT), in which this value represents the average percentage of the light transmitted by the solar cell in the visible wavelength (400-700 nm) based on the spectrally dependent response of the human eye. A minimum value of AVT=25% is generally suggested for window applications within the industry.

Figure 2:
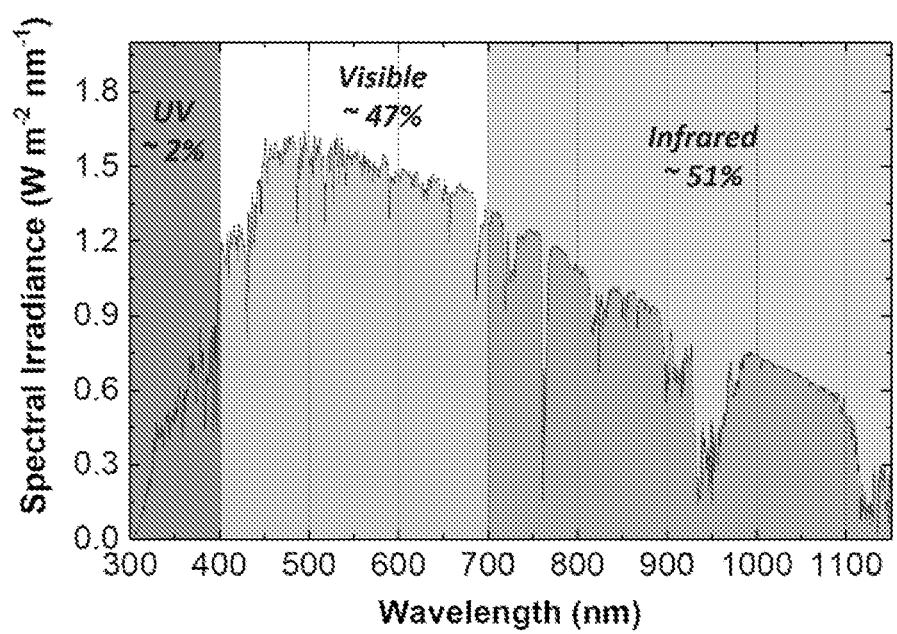
FIG. 2 is a diagram showing solar spectral irradiance at different wavelengths of light and the corresponding energy fraction.

Accordingly, for layer (1) and (2) (i.e., a front organic sub-cell and a back organic sub-cell respectively) of an exemplary embodiment of the heat insulating transparent tandem organic solar cell, as shown in FIG. 1, the light absorption requirements are fulfilled by selecting organic materials with a suitable bandgap. For example, for an ideal TSC, it is preferred that the ultraviolet (UV) and infrared (IR) or near-infrared (NIR) wavelengths be absorbed, while maintaining high transmittance in the visible range, since according to the energy distribution of a standard AM 1.5G solar spectrum, more than half of the solar energy is distributed within the NIR region (as shown in FIG. 2).

To enhance the photon collection inside the heat insulating transparent tandem organic solar cell, a photonic crystal structure such as a distributed Bragg reflector (DBR) can be positioned on top of a transparent electrode in various embodiments. An exemplary DBR is made of a periodic array combining a low refractive index layers and high refractive index layers causing light to be partially refracted, reflected, and transmitted at each interface, in which the lattice spacing and the layer refractive indexes of the DBR define whether the interference among reflected or transmitted beams is constructive or destructive at a specific wavelength.

Figure 3:
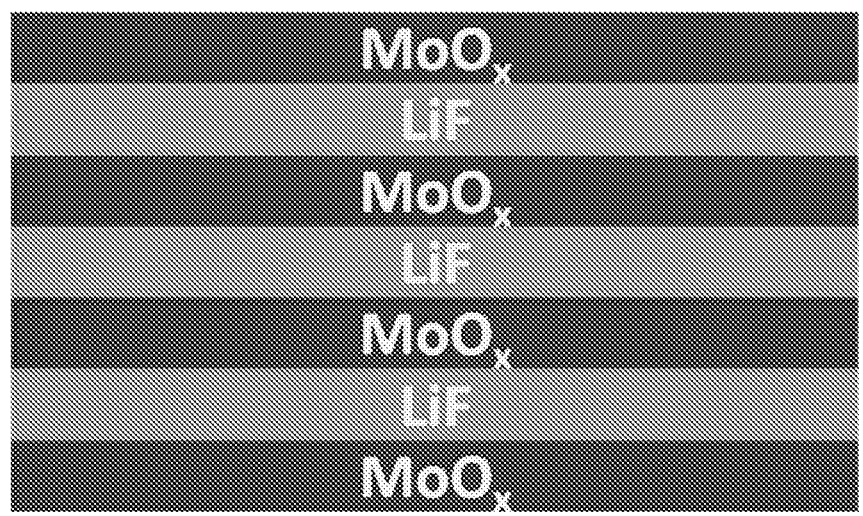
FIG. 3 is an exemplary diagram of a diffracted Bragg reflector in accordance with embodiments of the present disclosure.

Referring next to FIG. 3, the figure illustrates a 1D photonic crystal array comprising a periodic array of Lithium Fluoride (LiF) and Molybdenum Oxide ($MoO_x$) layers that can serve as a good mirror for the IR region of the light spectrum for various embodiments. In particular, such a 1D photonic crystal array selectively reflects a major portion of IR light while keeping a high visible light transmittance. During manufacture, such an exemplary DBR can be deposited by thermal evaporation or low-temperature solution processing which will impose no degradation on the solar cells underneath.

Figure 4A:
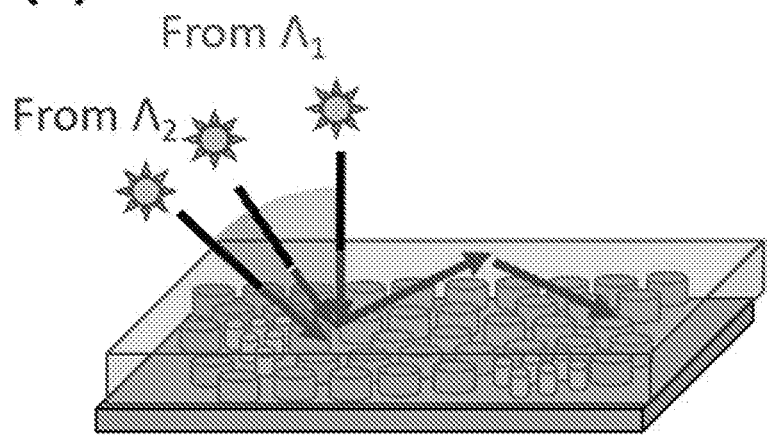
FIG. 4A is a schematic diagram of photoactive layers prepared on a quasi-periodic polycrystal nanopatterned (QPN) substrate in accordance with various embodiments of the present disclosure.
Figure 4B:
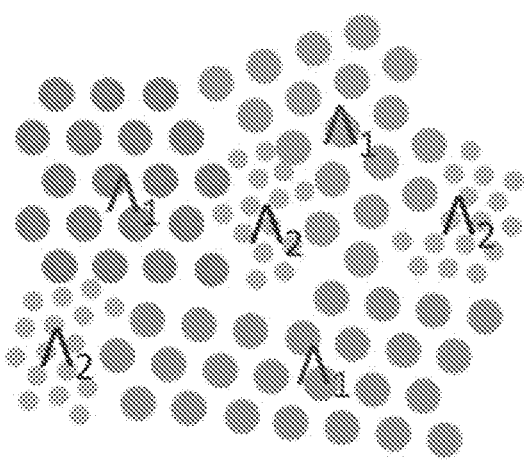
FIG. 4B is a schematic diagram showing a polycrystalline nanopattern with various pitch size in accordance with various embodiments of the present disclosure.
Figure 4C:
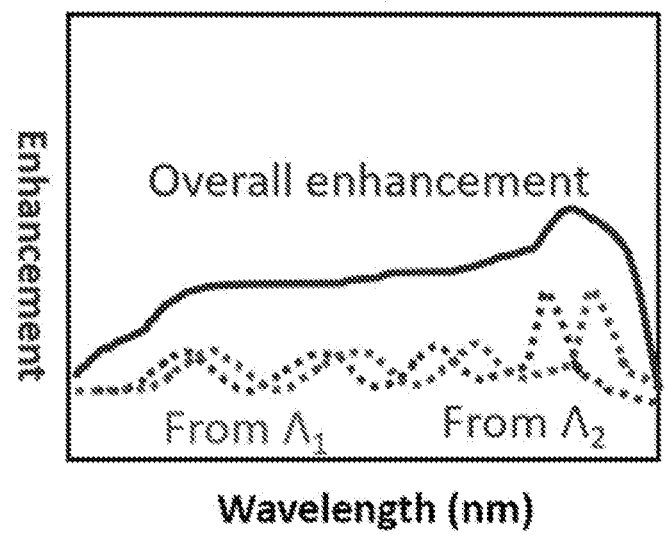
FIG. 4C is a plot demonstrating the predicted enhancement of sunlight harvesting at different wavelengths in accordance with various embodiments of the present disclosure.
Figure 4D:
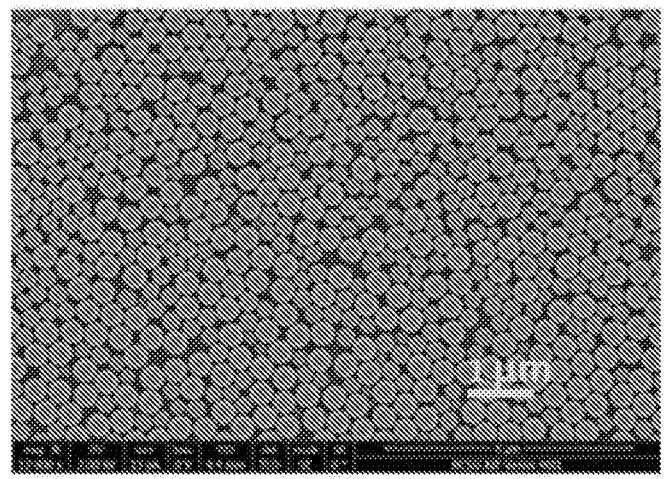
FIG. 4D is a scanning electron microscope image of an exemplary QPN in accordance with various embodiments of the present disclosure.

In addition to or in replacement of a planar DBR, quasi-periodic polycrystal nanopatterns (QPN) can be applied at a top or bottom of an exemplary solar cell for enhancing light absorption in a selective wavelength. While, traditionally, a solar tracker is required for turning the solar panel to maintain normal incidence (with the sun) for high efficiency, this increased installation and maintenance cost for solar tracking consumes unnecessary energy to turn the solar panel. Diversely, a main concept of QPN is to perform light harvesting by a light-scattering mechanism (for capturing sunlight). Compared to a periodic single crystal nanopattern, a quasi-periodic polycrystal nanopattern (QPN) advantageously couples a wide band of solar spectrum from a broad range of solid angles with high integrated photocurrents, as demonstrates in FIGS. 4A-4D. Here, FIG. 4A is a schematic diagram of photoactive layers prepared on a QPN substrate in accordance with various embodiments of the present disclosure; FIG. 4B is a schematic diagram showing a polycrystalline nanopattern with various pitch sizes in accordance with various embodiments of the present disclosure; FIG. 4C is a plot demonstrating the predicted enhancement of sunlight harvesting at different wavelengths (represented in FIGS. 4A-4C as A) in accordance with various embodiments of the present disclosure; and FIG. 4D is a scanning electron microscope image of an exemplary QPN in accordance with various embodiments of the present disclosure.

In summary, embodiments of the present disclosure provide a high-performance transparent tandem organic solar cell that can be used for power generation and heat insulation at the same time. With a proper arrangement of sub-cells that fully utilize the UV and IR regions while maintaining high transparency, high-performance transparent solar cells can be realized. In addition, by employing a DBR that effectively blocks IR light, transparent solar cells with enhanced heat insulating properties can also be realized having the following qualities: (1) an organic TSC with power conversion efficiency larger than 15%; (2) high average visible transmittance with a minimum value of 30%; (3) 85% or higher infrared radiation rejection; and (4) high open-circuit voltage (>2.5 V) with tandem architectures, among others. Asides from a DBR, a QPN is integrated in certain embodiments of the high-performance transparent tandem organic solar cell at a top or bottom of the solar cell, in which the QPN is configured to couple a wide band of solar spectrum from a broad range of solid angles with high integrated photocurrents.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the principles of the disclosure. All such modifications and variations are intended to be included herein within the scope of this disclosure and protected by the following claims.

The invention claimed is:

1. A transparent tandem organic solar cell comprising:
a transparent substrate;
a first transparent electrode disposed on a surface of the transparent substrate; a series of interconnecting organic active layers disposed on a surface of the first transparent electrode, wherein the series of organic interconnecting active layers comprises at least a front sub-cell that blocks ultraviolet wavelengths from passing through the front sub-cell; and a back sub-cell that blocks infrared wavelengths from passing through the back sub-cell; and
a distributed Bragg reflector disposed on a surface of the back sub-cell, wherein the distributed Bragg reflector reflects unblocked infrared photons at an interface between the back sub-cell and the distributed Bragg reflector;
wherein the series of interconnecting organic active layers are configured to allow wavelengths of visible light to pass through the transparent tandem organic solar cell;
wherein the transparent tandem organic solar cell further comprise a quasi-periodic polycrystal nanopattern structure with different width sizes that is positioned on the front sub-cell or the distributed Bragg reflector disposed on the surface of the back sub-cell.

2. The solar cell of claim 1, wherein the distributed Bragg reflector comprises a periodic array of Lithium Fluoride (LiF) and Molybdenum Oxide ($MoO_x$) layers.

3. The solar cell of claim 1, wherein the distributed Bragg reflector is configured to block heat energy from being supplied through the transparent tandem organic solar cell.

4. The solar cell of claim 1, wherein the transparent tandem organic solar cell is embedded in a window.

5. The solar cell of claim 1, wherein the transparent tandem organic solar cell is in a form of a film of photovoltaic material.

6. The solar cell of claim 1, wherein the series of interconnecting organic active layers further comprise at least one antireflective coating layer.

7. The solar cell of claim 1, wherein the series of interconnecting organic active layers are configured to convert the blocked wavelengths of light into electricity.

8. The solar cell of claim 1, wherein the transparent tandem organic solar cell is integrated into a building facade or rooftop.

9. A method of implementing a transparent tandem organic solar cell comprising:
disposing a first transparent electrode disposed on a surface of a transparent substrate;
disposing a series of interconnecting organic active layers on a surface of the first transparent electrode;
configuring the series of interconnecting organic active layers to allow wavelengths of visible light to pass through the series of interconnecting organic active layers, wherein the series of interconnecting organic active layers comprises at least a front sub-cell that blocks ultraviolet wavelengths from passing through the front sub-cell;
and a back sub-cell that blocks infrared wavelengths from passing through the back sub-cell;
disposing a mirror on a surface of the back sub-cell to form the transparent tandem organic solar cell;
coupling a quasi-periodic polycrystal nanopattern structure with different width sizes, wherein the quasi-periodic polycrystal nanopattern structure is positioned on the front sub-cell or the mirror disposed on the surface of the back sub-cell; and
reflecting unblocked infrared photons at an interface between the back sub-cell and the mirror.

10. The method of claim 9, wherein the mirror comprises a distributed Bragg reflector.

11. The method of claim 10, wherein the distributed Bragg reflector comprises a periodic array of Lithium Fluoride (LiF) and Molybdenum Oxide ($MoO_x$) layers.

12. The method of claim 9, further comprising applying the transparent tandem organic solar cell in a form of a film to a window of a structure.

13. The method of claim 12, wherein the structure comprises a building.

14. The method of claim 12, wherein the structure comprises a vehicle.

15. The method of claim 9, wherein the series of interconnecting organic active layers further comprise at least one antireflective coating layer.

16. The method of claim 9, further comprising converting the blocked wavelengths of light into electricity.

17. The method of claim 9, further comprising integrating the transparent tandem organic solar cell into a building facade or rooftop.

18. The method of claim 9, further comprising integrating the transparent tandem organic solar cell into an automobile windshield.

* * * * *